(12) United States Patent
Ben-Tzur et al.

(10) Patent No.: US 6,774,033 B1
(45) Date of Patent: Aug. 10, 2004

(54) METAL STACK FOR LOCAL INTERCONNECT LAYER

(75) Inventors: Mira Ben-Tzur, Sunnyvale, CA (US); Dafna Beery, Palo Alto, CA (US); Gorley L. Lau, Fremont, CA (US); Krishnaswamy Ramkumar, San Jose, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 10/287,258

(22) Filed: Nov. 4, 2002

(51) Int. Cl.$^7$ .......................................... H01L 21/4763
(52) U.S. Cl. ...................... 438/643; 438/685; 438/627
(58) Field of Search ................................ 438/685, 643, 438/627, 625, 618

(56) References Cited

U.S. PATENT DOCUMENTS

| 6,228,761 B1 | 5/2001 | Ngo et al. |
| 6,232,209 B1 * | 5/2001 | Fujiwara et al. ............ 438/585 |

* cited by examiner

Primary Examiner—Vu A. Le
Assistant Examiner—Brad Smith
(74) Attorney, Agent, or Firm—Okamoto & Benedicto LLP

(57) ABSTRACT

In one embodiment, a local interconnect layer in an integrated circuit is formed by depositing a first film over an oxide layer and depositing a second film over the first film. The first film may comprise titanium nitride, while the second film may comprise tungsten, for example. The first film and the second film may be deposited in-situ by sputtering. The second film may be etched using the first film as an etch stop, and the first film may be etched using the oxide layer as an etch stop.

17 Claims, 3 Drawing Sheets

METAL STACK FOR LOCAL INTERCONNECT LAYER

BACKGROUND OF THE INVENTION

1. Field of the Invention

The present invention relates generally to integrated circuits, and more particularly to integrated circuit fabrication processes and structures.

2. Description of the Background Art

Interconnect layers are employed to electrically couple various nodes of an integrated circuit. An integrated circuit may have several levels of interconnect layers, with a dielectric layer providing electrical isolation between levels. A hole through a dielectric layer, referred to as a "via", may be employed to provide electrical connectivity between two levels of interconnect layers.

An interconnect layer that is employed throughout a given level is referred to as a "regular interconnect layer". A regular interconnect layer may be a "first metal layer", a "second metal layer", a "third metal layer" and so on depending on how high the regular interconnect layer is from the substrate. For example, a first regular interconnect layer above a substrate is referred to as a first metal layer, while a next regular interconnect layer above the first metal layer is referred to as a second metal layer.

An interconnect layer may also be employed in a relatively small section of an integrated circuit. Such an interconnect layer, referred to as a "local interconnect layer", is typically formed under a first metal layer. In memory applications, for example, a local interconnect layer may provide relatively short electrical paths between devices within a cell. As is well known, the requirements for a local interconnect layer are different form that of a regular interconnect layer. That is, techniques for improving the performance of regular interconnect layers may or may not be suitable for local interconnect layers. For example, because of its function and location in the integrated circuit, a local interconnect layer has to be relatively thin compared to a regular interconnect layer to minimize the aspect ratio of resulting interconnect lines. Whereas a regular interconnect layer may be made thicker to reduce its resistivity, increasing the thickness of a local interconnect layer may not be feasible. On the other hand, because a local interconnect layer does not have to carry relatively large amounts of electrical current, its resistivity does not need to be very low.

SUMMARY

The present invention relates to an improved technique for forming a local interconnect layer in an integrated circuit. In one embodiment, a local interconnect layer in an integrated circuit is formed by depositing a first film over an oxide layer and depositing a second film over the first film. The first film may comprise titanium nitride, while the second film may comprise tungsten, for example. The first film and the second film may be deposited by sputtering. The second film may be etched using the first film as an etch stop, and the first film may be etched using the oxide layer as an etch stop.

These and other features of the present invention will be readily apparent to persons of ordinary skill in the art upon reading the entirety of this disclosure, which includes the accompanying drawings and claims.

Figure 1:
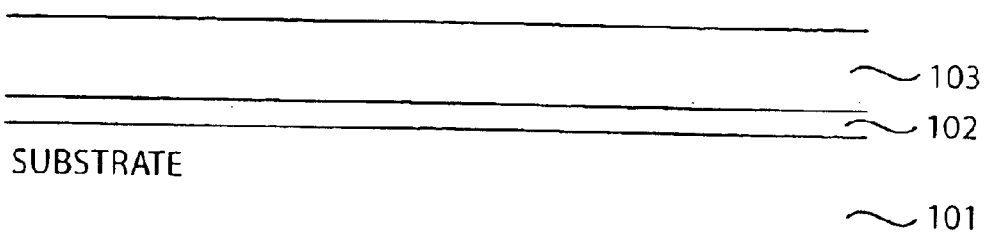
FIGS. 1–5 schematically show side cross-sectional views of an integrated circuit being fabricated in accordance with an embodiment of the present invention.

The use of the same reference label in different drawings indicates the same or like components. Drawings are not necessarily to scale unless otherwise noted.

DETAILED DESCRIPTION

In the present disclosure, numerous specific details are provided such as examples of materials, process steps, and structures to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

It is to be noted that as used in the present disclosure, the terms "over", "overlying", "under" and "underlying" refer to the relative placement of two materials that may or may not be directly in contact with each other. That is, the two materials may be separated by another material.

A local interconnect layer may be conventionally formed by depositing a film of titanium nitride over an oxide layer. For example, a 1000 Angstroms or 700 Angstroms thick titanium nitride film may be deposited over an oxide layer by sputtering. Thereafter, a resist material may be formed over the titanium nitride film. The titanium nitride film may then be etched to form one or more local interconnect lines. One problem with the just mentioned process is that the nitrogen in the titanium nitride film reacts with the resist material. This phenomena, referred to as "resist poisoning", degrades the patterned resist material, thereby adversely affecting the patterning process.

To prevent resist poisoning, the titanium nitride film may be oxidized prior to patterning a resist material thereon. This results in the formation of titanium oxynitride on the surface of the titanium nitride film. Although, the titanium oxynitride serves as a barrier between titanium nitride and the resist material to prevent resist poisoning, it comes with its own share of problems. For one, because it is a relatively hard material, titanium oxynitride makes electrical probing of the underlying titanium nitride film very difficult. Specifically, it is very difficult for a probe to penetrate through the titanium oxynitride and contact the titanium nitride film for electrical testing. Additionally, titanium oxynitride increases the resistance of the resulting interconnect line.

FIGS. 1–5 schematically show side cross-sectional views of an integrated circuit being fabricated in accordance with an embodiment of the present invention. Beginning in FIG. 1, a local interconnect layer may be formed by first depositing an oxide layer 102 on a substrate 101. Substrate 101 may be a semiconductor substrate, for example. In one embodiment, oxide layer 102 is deposited using TEOS (tetraethyl ortho-silicate) as a precursor. Oxide layer 102 may be deposited to a thickness of 3000 Angstroms by plasma enhanced chemical vapor deposition (PECVD). The thickness of oxide layer 102 will depend on the application. Note that circuit components that may be below oxide layer 102, such as gates, are not shown in FIGS. 1–5 for clarity of illustration.

Still referring to FIG. 1, a film 103 may be deposited over oxide layer 102. In one embodiment, film 103 comprises titanium nitride. Film 103 may be deposited using a sputtering process. In one embodiment, film 103 is deposited by sputtering titanium in the presence of a nitrogen plasma (also referred to as "reactive sputtering"). A film 103 of titanium nitride may be deposited to a thickness of about 200 to 300 Angstroms, preferably to a thickness of about 300 Angstroms. The thickness of film 103 may also be varied to meet the requirements of specific applications.

The inventors believe that titanium nitride is a relatively good local interconnect material because it may be patterned using an oxide layer as an etch stop. Additionally, titanium nitride may serve as a barrier and adhesion layer for a subsequently deposited tungsten film.

Figure 2:
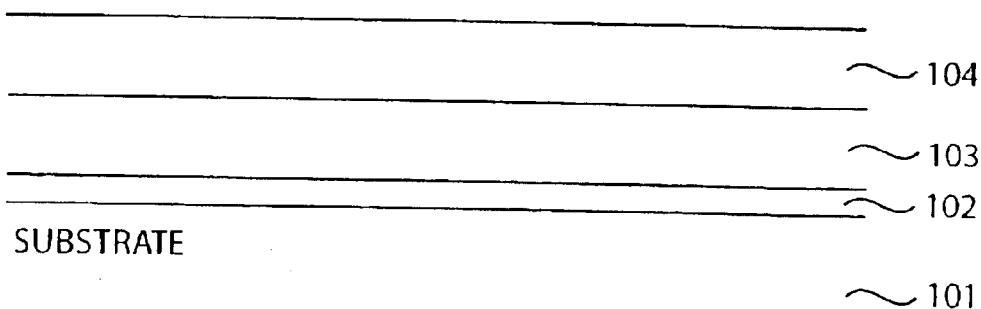

In FIG. 2, a film 104 may be deposited over film 103. In one embodiment, film 104 comprises tungsten. Film 104 may be deposited using a sputtering process. A film 104 of tungsten may be deposited to a thickness of about 100 to 300 Angstroms, preferably to a thickness of about 300 Angstroms. The thickness of film 104 may also be varied to meet the requirements of specific applications. In one embodiment, the thickness of a metal stack comprising a film 104 of tungsten over a film 103 of titanium nitride is equal to or less than about 600 Angstroms.

In one embodiment, a film 104 of tungsten is deposited in-situ after the deposition of a film 103 of titanium nitride. That is, a film 104 of tungsten may be deposited using the same multi-chamber physical vapor deposition system used to deposit a film 103 of titanium nitride. A multi-chamber physical vapor deposition system is also referred to as a "cluster tool". A cluster tool typically has several chambers, one for each type of process. A cluster tool may have a chamber for reactively sputtering titanium nitride and another chamber for sputtering tungsten. A cluster tool may have a robot for moving a wafer being processed from one chamber to another. An example cluster tool that may be employed for sputtering films 103 and 104 is the ENDURA physical vapor deposition system commercially available from Applied Materials, Inc. of Santa Clara, Calif.

The use of a metal stack comprising tungsten over titanium nitride in a local interconnect layer provides several advantages heretofore unrealized. As already mentioned, tungsten and titanium nitride may be deposited in-situ using the same physical vapor deposition system, thereby allowing for an efficient process flow. Tungsten also has a relatively low resistivity compared to titanium nitride. This allows the metal stack to be relatively thin, while keeping resistivity relatively low. A thin metal stack reduces the aspect ratio of the resulting interconnect line, thereby allowing for better sidewall and bottom coverage during deposition.

Relatively speaking, tungsten is also a chemically stable material. A resist material may be formed over a tungsten/titanium nitride stack without having to deal with resist poisoning issues. This eliminates an oxidizing step that may have to be performed (using a separate tool) when using titanium nitride alone. Because of tungsten's stability, the sheet resistance and critical dimensions of a tungsten/titanium nitride stack do not significantly change during the fabrication process. Electrical testing may also be performed on a tungsten/titanium nitride stack because the tungsten surface does not appreciably harden and remains probable. On some applications, the tungsten may also serve as a hard mask for etching the underlying titanium nitride.

Figure 3:
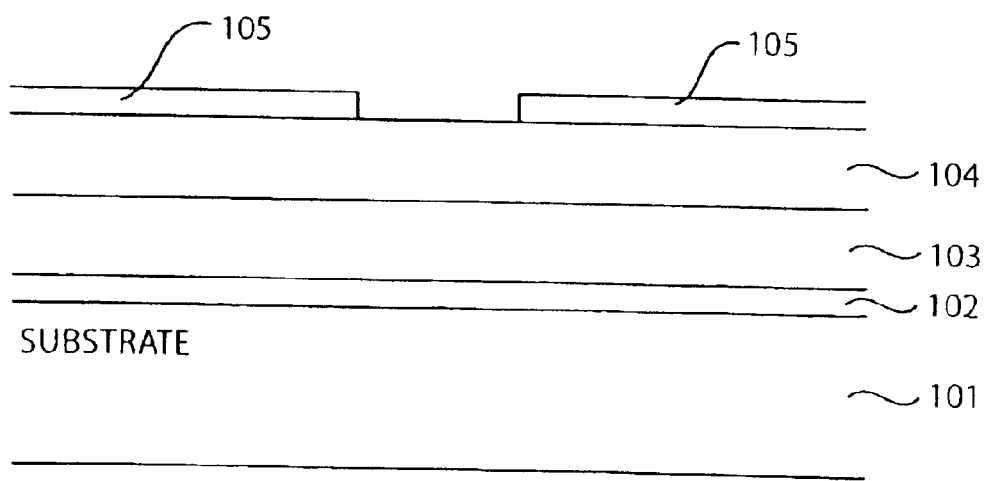

Turning to FIG. 3, masks 105 may be formed over film 104. Masks 105 may be of a resist material, such as a negative or positive photoresist. Masks 105 may be formed using conventional lithography techniques. As noted above, a film 104 of tungsten separates masks 105 from a film 103 of titanium nitride, thereby preventing resist poisoning.

Figure 4:
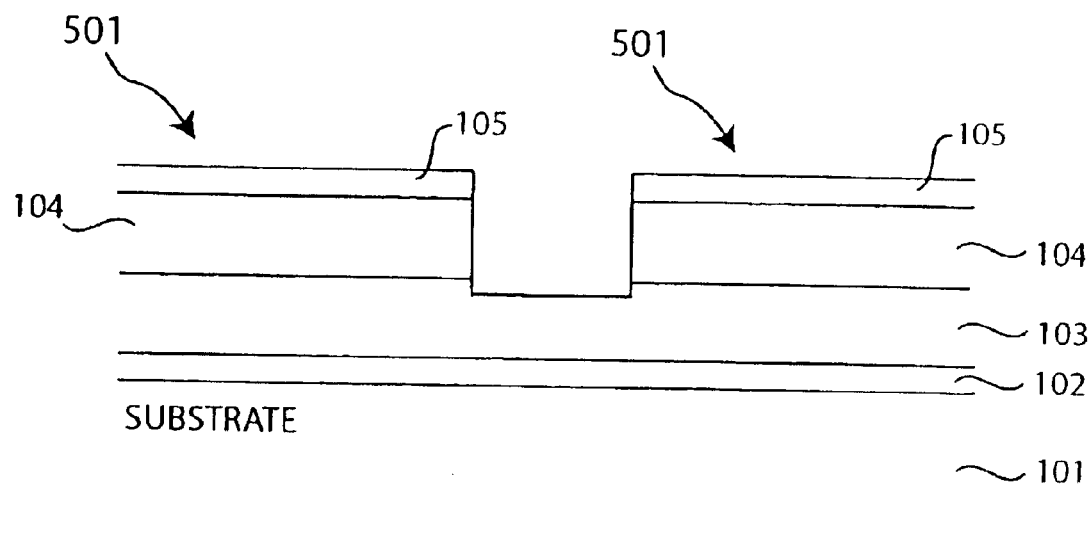
Figure 5:
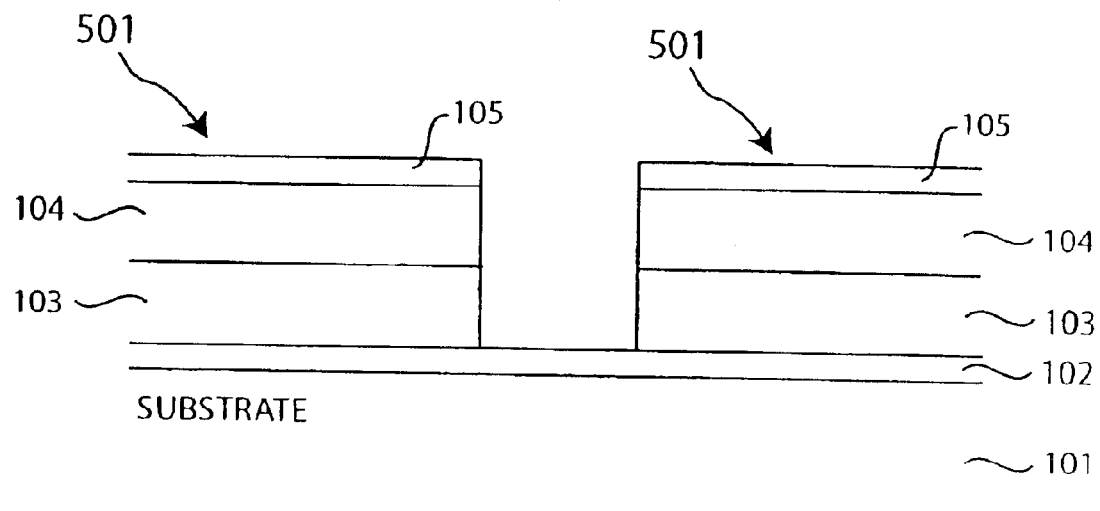

FIGS. 4 and 5 illustrate the patterning of the local interconnect layer to form local interconnect lines 501. In FIG. 4, film 104 is etched using film 103 as an etch stop. In one embodiment, a fluorine-based etchant, such as sulfur hexafluoride ($SF_6$), is employed to etch a film 104 of tungsten stopping on a film 103 of titanium nitride. Note that a film 103 of titanium nitride advantageously helps prevent gouging of oxide layer 102 during local interconnect etching. That is, because the chemistry for etching an oxide layer is similar to that for etching tungsten, a single layer of tungsten without an underlying titanium nitride would be relatively difficult to etch without also etching portions of oxide layer 102.

In FIG. 5, film 103 is etched using oxide layer 102 as an etch stop. In one embodiment, a chlorine-based etchant, such as boron trichloride ($BCl_3$) or chlorine ($Cl_2$), is employed to etch a film 103 of titanium nitride stopping on oxide layer 102. Masks 105 may be stripped after the etching of film 103. Thereafter, dielectric and regular interconnect layers (e.g., a first metal layer) may be formed over interconnect lines 501. Interconnect lines 501 may also be probed for electrical testing after masks 105 have been stripped.

Figure 6:
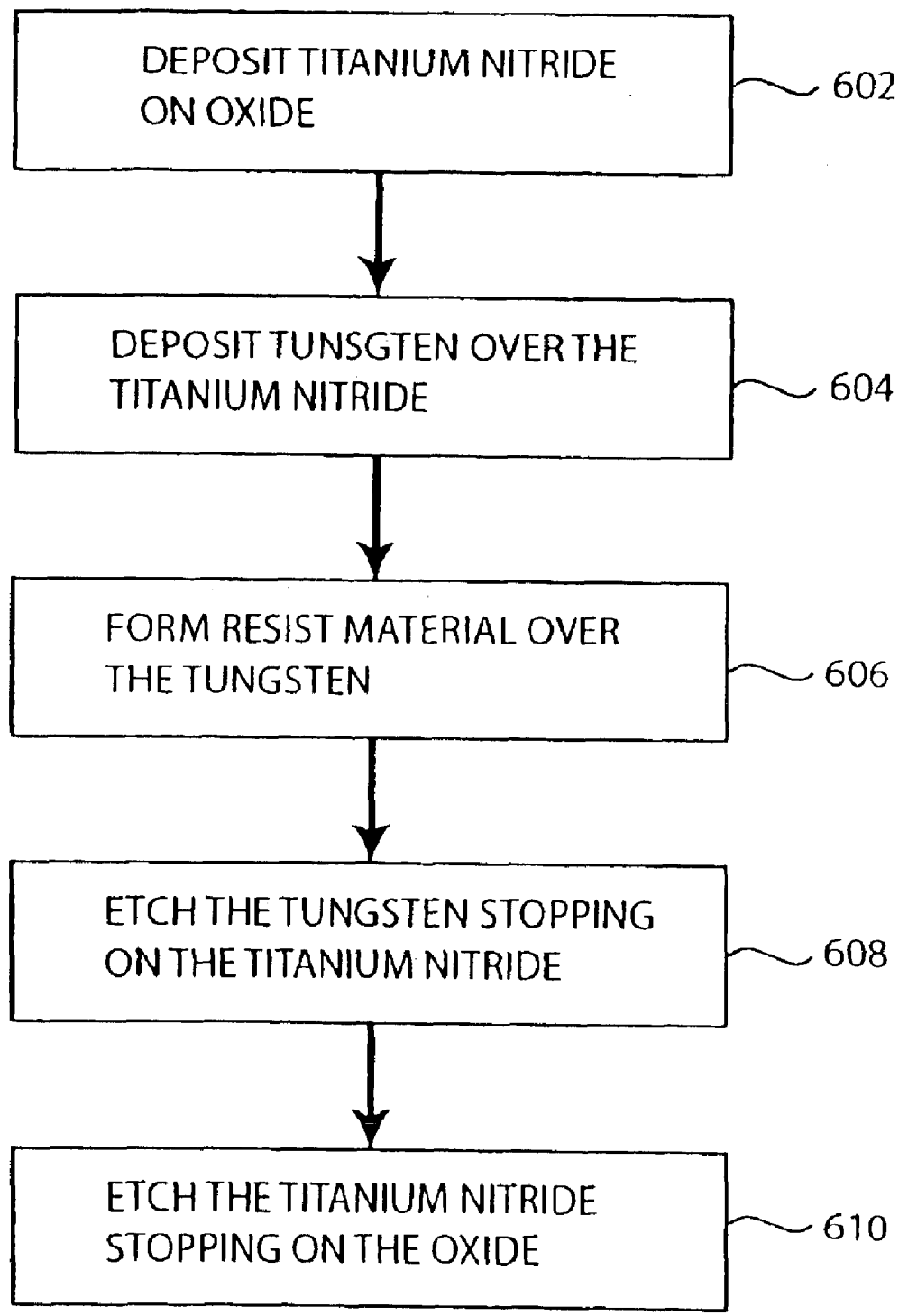
FIG. 6 shows a flow diagram of a method of forming a local interconnect layer in accordance with an embodiment of the present invention.

Referring now to FIG. 6, there is shown a flow diagram of a method of forming a local interconnect layer in accordance with an embodiment of the present invention. Beginning in step 602, a titanium nitride film is deposited over an oxide layer. The oxide layer may be over a substrate, such as a semiconductor substrate.

In step 604, a tungsten film is deposited over the titanium nitride film.

In step 606, a resist material is formed over the tungsten film.

In step 608, the tungsten film is etched using the titanium nitride film as an etch stop. In one embodiment, the tungsten film is etched using a fluorine-based etchant.

In step 610, the titanium nitride film is etched using the oxide layer as an etch stop. In one embodiment, the titanium nitride film is etched using a chlorine-based etchant. The etching of the titanium nitride film completes the etching of the metal stack comprising tungsten over titanium nitride to form local interconnect lines.

After step 610, the resist material may be stripped and additional layers may be formed over the resulting interconnect lines. For example, a dielectric layer may be formed over the resulting interconnect lines. Thereafter, a first metal layer may be formed over the dielectric layer. The tungsten/titanium nitride stack may also be probed for electrical testing after the resist material is stripped.

Table 1 below shows the results of sheet resistance measurements performed on various test structures (not shown) just after the local interconnect etch but before the formation of the passivation level. This kind of testing is also referred to as an "in-line" test because it is performed in the middle of the integrated circuit fabrication process. The sheet resistance measurements were performed using conventional 4-point probe electrical testing.

In Table 1, the "W/TiN" column indicates the thicknesses of the tungsten and titanium nitride films of the metal stack in Angstroms. For example, "100/300" indicates that the tungsten film is 100 Angstroms thick, while the titanium nitride film is 300 Angstroms thick in the test structure; "200/200" indicates that the tungsten film is 200 Angstroms thick, while the titanium nitride film is 200 Angstroms thick in the test structure; and so on. Table 1 shows the average sheet resistance (in Ohm/sq.) and the standard deviation (labeled as "STDEV") for several test structures 101

TABLE 1

RESULTS OF IN-LINE TESTING

| W/TiN (A) | | Sheet Resistance (ohm/sq.) |
|---|---|---|
| 100/300 | AVERAGE | 25.67 |
| 100/300 | STDEV | 0.64 |
| 200/200 | AVERAGE | 17.12 |
| 200/200 | STDEV | 0.68 |
| 300/200 | AVERAGE | 10.88 |
| 300/200 | STDEV | 0.28 |
| 300/300 | AVERAGE | 9.41 |
| 300/300 | STDEV | 0.27 |

As shown in Table 1, the 300/300 metal stack (i.e., metal stack with 300 Angstroms of tungsten and 300 Angstroms of titanium nitride) resulted in the lowest sheet resistance. Specifically, the 300/300 metal stack resulted in a sheet resistance of only 9.41 Ohms/sq. with a standard deviation of 0.27.

Table 2 shows the results of sheet resistance measurements performed on the same test structures after the formation of the passivation level. This kind of testing is also referred to as an "end-of-line" test because it is performed at or near the end of the integrated circuit fabrication process.

TABLE 2

RESULTS OF END-OF-LINE TESTING

| W/TiN (A) | | Sheet Resistance (ohm/sq.) |
|---|---|---|
| 100/300 | AVERAGE | 24.75 |
| 100/300 | STDEV | 0.77 |
| 200/200 | AVERAGE | 16.66 |
| 200/200 | STDEV | 0.40 |
| 200/300 | AVERAGE | 10.71 |
| 200/300 | STDEV | 0.30 |
| 300/200 | AVERAGE | 10.73 |
| 300/200 | STDEV | 0.26 |
| 300/300 | AVERAGE | 9.22 |
| 300/300 | STDEV | 0.21 |

Comparing Table 1 and Table 2, note that the results of the in-line and end-of-line testing are not significantly different. Also, as is evident from the standard deviation, the testing results have relatively tight distribution. The inventors believe that the aforementioned results are attributable to the stability of the tungsten film in this process.

While specific embodiments of the present invention have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A method of forming a local interconnect layer in an integrated circuit, the method comprising:

depositing a first film over an oxide layer, the first film comprising titanium nitride; and depositing a second film over the first film, the second film comprising tungsten, the first film and the second film forming a metal stack of the local interconnect layer.

2. The method of claim 1 wherein the first film and the second film are deposited in-situ.

3. The method of claim 1 wherein the first film and the second film are deposited using a sputtering process.

4. The method of claim 1 wherein the first film and the second film from a metal stack having a thickness equal to or less than about 600 Angstroms.

5. The method of claim 1 wherein the first film is deposited to a thickness equal to or less than about 300 Angstroms.

6. The method of claim 1 wherein the second film is deposited to a thickness equal to or less than about 300 Angstroms.

7. The method of claim 1 wherein each of the first film and the second film is deposited to a thickness of about 300 Angstroms.

8. The method of claim 1 wherein the first film and the second film form a metal stack having a sheet resistance equal to or less than about 10 Ohm/sq.

9. The method of claim 1 further comprising:

etching the second film to stop on the first film; and etching the first film to stop on the oxide layer.

10. The method of claim 9 wherein the oxide layer is over a semiconductor substrate.

11. The method of claim 1 further comprising:

etching the second film with a fluorine-based etchant.

12. The method of claim 1 further comprising:

etching the first film with a chlorine-based etchant.

13. The method of claim 1 further comprising:

probing the second film to electrically test the metal stack.

14. The method of claim 1 further comprising:

depositing a resist material over the second film.

15. A method of forming a local interconnect layer in an integrated circuit, the method comprising:

sputtering a first film over an oxide, the first film comprising titanium nitride;

sputtering a second film over the first film in a same tool employed to sputter the first film, the second film comprising tungsten, the first film and the second film forming a metal stack of the local interconnect layer.

16. The method of claim 15 wherein the first film and the second film form a metal stack having a thickness equal to or less than about 600 Angstroms.

17. The method of claim 15 further comprising:

probing the second film to electrically test the material stack.

* * * * *

UNITED STATES PATENT AND TRADEMARK OFFICE
CERTIFICATE OF CORRECTION

PATENT NO. : 6,774,033 B1
DATED : August 10, 2004
INVENTOR(S) : Ben-Tzur et al.

It is certified that error appears in the above-identified patent and that said Letters Patent is hereby corrected as shown below:

Column 6,
Lines 9-11, should read -- 4. The method of claim 1 wherein the first and second film form a metal stack having a thickness equal to or less than about 600 Angstroms. --

Signed and Sealed this

Twenty-first Day of December, 2004

JON W. DUDAS
*Director of the United States Patent and Trademark Office*